US012672568B2

(12) United States Patent
Yuan et al.

(10) Patent No.: US 12,672,568 B2
(45) Date of Patent: Jun. 30, 2026

(54) SUBSTRATE HAVING AN INCREASED METAL TRACE THICKNESS

(71) Applicant: Sandisk Technologies, Inc., Milpitas, CA (US)

(72) Inventors: Rui Yuan, Shanghai (CN); Zengyu Zhou, Shanghai (CN); Yihao Chen, Shanghai (CN); Fen Yu, Shanghai (CN); Wenbin Qu, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 455 days.

(21) Appl. No.: 18/357,728

(22) Filed: Jul. 24, 2023

(65) Prior Publication Data

US 2024/0332156 A1 Oct. 3, 2024

Related U.S. Application Data

(60) Provisional application No. 63/493,824, filed on Apr. 3, 2023.

(51) Int. Cl.
| | |
|---|---|
| *H10W 70/65* | (2026.01) |
| *H10W 72/20* | (2026.01) |
| *H10W 72/00* | (2026.01) |
| *H10W 90/00* | (2026.01) |

(52) U.S. Cl.
CPC ...... *H10W 70/65* (2026.01); *H10W 72/07236* (2026.01); *H10W 72/252* (2026.01); *H10W 90/724* (2026.01)

(58) Field of Classification Search
CPC .................................................. H01L 23/49838
See application file for complete search history.

(56) References Cited

U.S. PATENT DOCUMENTS

| | | | | | |
|---|---|---|---|---|---|
| 8,896,118 | B2 * | 11/2014 | Shahidi | ............... | H10W 70/093 |
| | | | | | 257/737 |
| 9,508,671 | B2 * | 11/2016 | Chiu | .................... | H10W 74/131 |
| 2005/0023704 | A1 * | 2/2005 | Lin | ......................... | H05K 1/111 |
| | | | | | 257/E23.079 |
| 2006/0216860 | A1 * | 9/2006 | Pendse | ................... | H10W 70/65 |
| | | | | | 257/E23.068 |
| 2009/0236738 | A1 * | 9/2009 | Shim | ...................... | H10W 70/69 |
| | | | | | 257/737 |
| 2010/0193944 | A1 * | 8/2010 | Castro | ................. | H10W 90/701 |
| | | | | | 257/737 |
| 2012/0043672 | A1 * | 2/2012 | Cho | ...................... | H10W 70/05 |
| | | | | | 257/E23.06 |
| 2013/0020698 | A1 * | 1/2013 | Hsieh | .................... | H10W 72/20 |
| | | | | | 257/737 |

(Continued)

*Primary Examiner* — William A Harriston
(74) *Attorney, Agent, or Firm* — DENTONS Durham Jones Pinegar

(57) ABSTRACT

A thickness of a signal trace on a printed circuit board (PCB) or a substrate is increased by intentionally forming a solder bridge on a surface of the signal trace during a reflow process in which a flip chip die or other computing component is mounted to the PCB or the substrate. Specifically, adjacent interconnects of the flip chip die are coupled to the same signal trace on the PCB or the substrate. During the reflow process, solder associated with each interconnect flows into a space or area defined by the adjacent interconnects and forms a solder bridge within the space, thereby increasing a thickness of the signal trace.

20 Claims, 5 Drawing Sheets

(56) References Cited

U.S. PATENT DOCUMENTS

2015/0214175 A1* 7/2015 Kiyono .............. H10W 72/072
257/737
2016/0307864 A1* 10/2016 Chiu ....................... H01L 24/05

* cited by examiner

320

310

300

320

310

300

SUBSTRATE HAVING AN INCREASED METAL TRACE THICKNESS

CROSS-REFERENCE TO RELATED APPLICATIONS

The present application claims priority to U.S. Provisional Application No. 63/493,824 entitled "A SUBSTRATE HAVING AN INCREASED METAL TRACE THICKNESS", filed Apr. 3, 2023, the entire disclosure of which is hereby incorporated by reference in its entirety.

BACKGROUND

As demand for semiconductor chips continues to increase, so do the demands for higher performance, higher density and smaller size. In an effort to meet these demands, semiconductor chip manufacturers are using thinner metal layers and/or dielectric materials when fabricating substrates and/or printed circuit boards (PCBs). Adopting thinner materials reduces a height of the semiconductor chips. Additionally, semiconductor manufacturers are reducing a width of semiconductor chips by reducing a width, size and/or spacing of various metal traces that are provided in the substrate or PCBs.

However, as the metal layers and/or the dielectric materials of the substrates/PCBs get thinner, and as metal traces get narrower and/or closer together, the risk of higher impedance of the metal traces increases. Higher impedance could lead to signal mismatch, cause signal reflection between computing components and/or be harmful to the signal integrity of the semiconductor chip.

Accordingly, it would be beneficial to increase a thickness of at least a portion of a metal trace of a substrate or PCB while still utilizing thinner materials when fabricating the substrate or PCB.

SUMMARY

The present application describes using solder to increase a thickness (or a width) of a metal trace that is provided on a surface of a substrate and/or a printed circuit board (PCB). Increasing the thickness of the metal trace may improve impedance mismatch between various components of an integrated circuit or semiconductor chip-especially as a thickness, width and/or pitch of/between metal traces gets smaller and smaller as a result of performance and miniaturization demands.

In the examples described herein, the thickness of the metal trace may be increased by intentionally causing a solder bridge to form between two solder bumps of adjacent interconnects (e.g., copper pillars) of a computing component (e.g., a flip chip die) when the computing component is electrically and/or communicatively coupled to the substrate or PCB.

In another example, the thickness of the metal trace may be increased by a pre-solder process during a surface mount technology (SMT) process. In an example, the pre-solder process is a process in which solder is printed or is otherwise disposed/provided on one or more metal traces of the substrate or PCB. In an example, the pre-solder process may occur prior to or during a stencil printing process and/or prior to or during a component placement process of the SMT process. Once the solder is printed on the metal trace, a reflow process may cause the solder on the metal trace to fuse to the metal trace thereby increasing the thickness of the metal trace.

Accordingly, the present application describes an integrated circuit that includes a substrate and a computing component. In an example, the substrate includes a metal trace having an initial thickness. The computing component includes a first interconnect having a first solder bump and a second interconnect having a second solder bump. The first interconnect is electrically coupled to the metal trace at a first location on the metal trace and the second interconnect is electrically coupled to the metal trace at a second location on the metal trace. A solder bridge is formed on the metal trace between the first solder bump and the second solder bump. In an example, the solder bridge increases the thickness of the metal trace in an area defined by the first interconnect and the second interconnect.

The present application also describes a method for coupling a first computing component to a second computing component to increase a thickness of a metal trace associated with the second computing component. In an example, the method includes coupling a solder bump of a first interconnect of the first computing component and a solder bump of a second interconnect of the first computing component to the metal trace of the second computing component. A solder bridge is then formed on the metal trace between the solder bump of the first interconnect and the solder bump of the second interconnect. In an example, the solder bridge is formed on the metal trace in an area defined by the first interconnect and the second interconnect.

In yet another example, the present application describes an integrated circuit that includes a substrate and a computing component. In an example, the substrate includes a connection means having a thickness. The computing component includes a first interconnect means and a second interconnect means. In an example, the first interconnect means has a first attachment means and is electrically coupled to the connection means at a first location on the connection means. Likewise, the second interconnect means has a second attachment means and is electrically coupled to the connection means at a second location on the connection means. In an example, a bridge is formed on the connection means between the first attachment means and the second attachment means. The bridge increases the thickness of the connection means in an area defined by the first interconnect means and the second interconnect means.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1A:
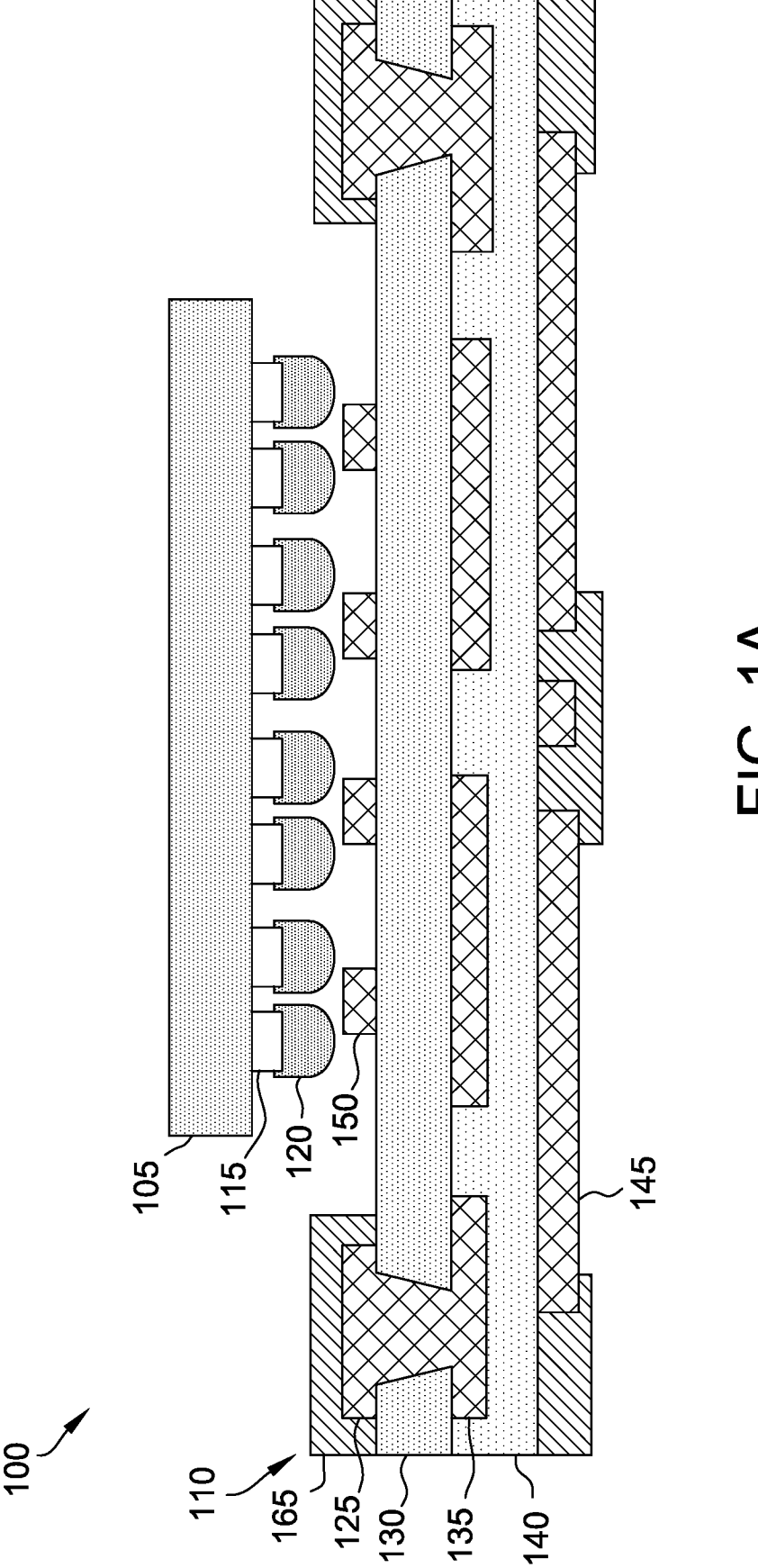
FIG. 1A illustrates an integrated circuit having a first computing component and a second computing component prior to each component being communicatively coupled according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

Demand for semiconductor chips and integrated circuits continues to increase. In addition to the overall demand for these components, there is also a demand for higher performance, higher density and smaller size.

In an effort to meet these demands, substrates and/or printed circuit boards (PCBs) are being fabricated using thinner metal layers and/or dielectric materials. Adopting thinner materials reduces a Z dimension or height of the entire semiconductor package. Another way to reduce the size of the semiconductor package is to reduce a width, size and/or spacing of various metal traces that are present in the substrate or PCBs. This process effectively reduces a width or a X/Y dimension of the semiconductor package.

However, as the metal layers and/or dielectric materials get thinner, and as the metal traces get narrower and/or closer together, the risk of higher impedance of the metal traces increases. Higher impedance of the metal traces typically lead to signal mismatch, cause signal reflection and/or is harmful to the signal integrity of the semiconductor chip.

In order to address the above, the present application describes using solder to increase a thickness and/or width of a metal trace of a substrate and/or a PCB. In one example, the thickness of the metal trace may be increased by intentionally causing a solder bridge to form between two solder bumps of adjacent interconnects (e.g., copper pillars) of a computing component (e.g., a flip chip die) when the computing component is electrically and/or communicatively coupled to the substrate or the PCB.

In another example, the thickness and/or width of the metal trace may be increased by using a pre-solder process during a surface mount technology (SMT) process. In this example, solder is printed on or is otherwise disposed/provided on the metal trace of the substrate or PCB prior to or during a stencil printing process and/or a component placement process of the SMT process. Once the solder is printed on the metal trace, a reflow process may cause the solder on the metal trace to fuse to the metal trace thereby increasing a thickness of the metal trace.

Accordingly, many technical benefits may be realized including, but not limited to, reducing impedance mismatch between computing components thereby reducing the risk of signal reflection, enabling semiconductor chips and/or integrated circuits to be fabricated into smaller packages, enabling the use of narrower signal/metal traces on various substrates and/or PCBs thereby increasing an input/output interface of the various packages.

These benefits, and more, will be explained in greater detail with respect to FIG. 1A-FIG. 4.

FIG. 1A illustrates an integrated circuit 100 having a first computing component 105 and a second computing component 110 prior to each component being communicatively coupled according to an example. In the example shown in FIG. 1A, the first computing component 105 is a flip chip die and the second computing component 120 is a substrate. Although the first computing component 105 is identified as a flip chip die, the first computing component 105 may be an integrated circuit, a semiconductor chip, a semiconductor die or other such computing component that is mounted to a second computing component. Likewise, although the second computing component 110 is identified as a substrate, the second computing component 110 may be a printed circuit board, another integrated circuit, or the like.

In the example shown in FIG. 1A, the first computing component 105 includes multiple interconnects 115 extending from a surface or die of the first computing component 105. Each interconnect 115 may be a copper pillar, a solder ball, a solder bump or another interconnect that enables the first computing component 105 to be communicatively and/or electrically coupled to the second computing component 110. Although the interconnects 115 are shown in a vertical (e.g., ninety degree) orientation, the interconnects 115 may be arranged in a different (e.g., forty-five degree) orientation.

Additionally, each interconnect 115 may include a solder bump 120. As will be explained in greater detail below, solder from the solder bump 120 provided on the first computing component 105 may be used to increase a thickness of a connection mechanism (e.g., a metal/copper trace) provided on a surface of the second computing component 110.

The second computing component 110 may include multiple layers (e.g., metal layers and/or dielectric layers). For example, the second computing component 110 includes a first metal layer 125, a prepeg layer 130, a second metal layer 135, a dielectric layer 140 and a third metal layer 145. The second computing component 110 may also include a solder mask 165. Although specific layers are mentioned, the second computing component 110 may include additional layers or fewer layers. The second computing component 110 may also include one or more connection mechanisms (e.g., solder balls) provided on/underneath the third metal layer 145 to enable the integrated circuit 100 to be communicatively coupled to a printed circuit board or other substrate.

As shown in FIG. 1A, one or more connection mechanisms may be provided on a surface of the second computing component 110. The connection mechanisms are referred to herein as metal trace(s) 150. In an example, each metal trace 150 may be comprised of a metal (e.g., silver, copper, gold) and have a thickness and a width. In an example, the thickness of each metal trace 150 may be twelve micrometers or less. Likewise, the width of each metal trace 150 may be between ten micrometers and twenty-five micrometers. Additionally, a pitch between each metal trace 150 may be between twenty micrometers and fifty micrometers. Although specific ranges are mentioned, the thickness, width and/or pitch of each metal trace 150 may vary based on, for example, a design and/or intended use of the second computing component 120 and/or a desired package size of the integrated circuit 100.

Figure 1B:
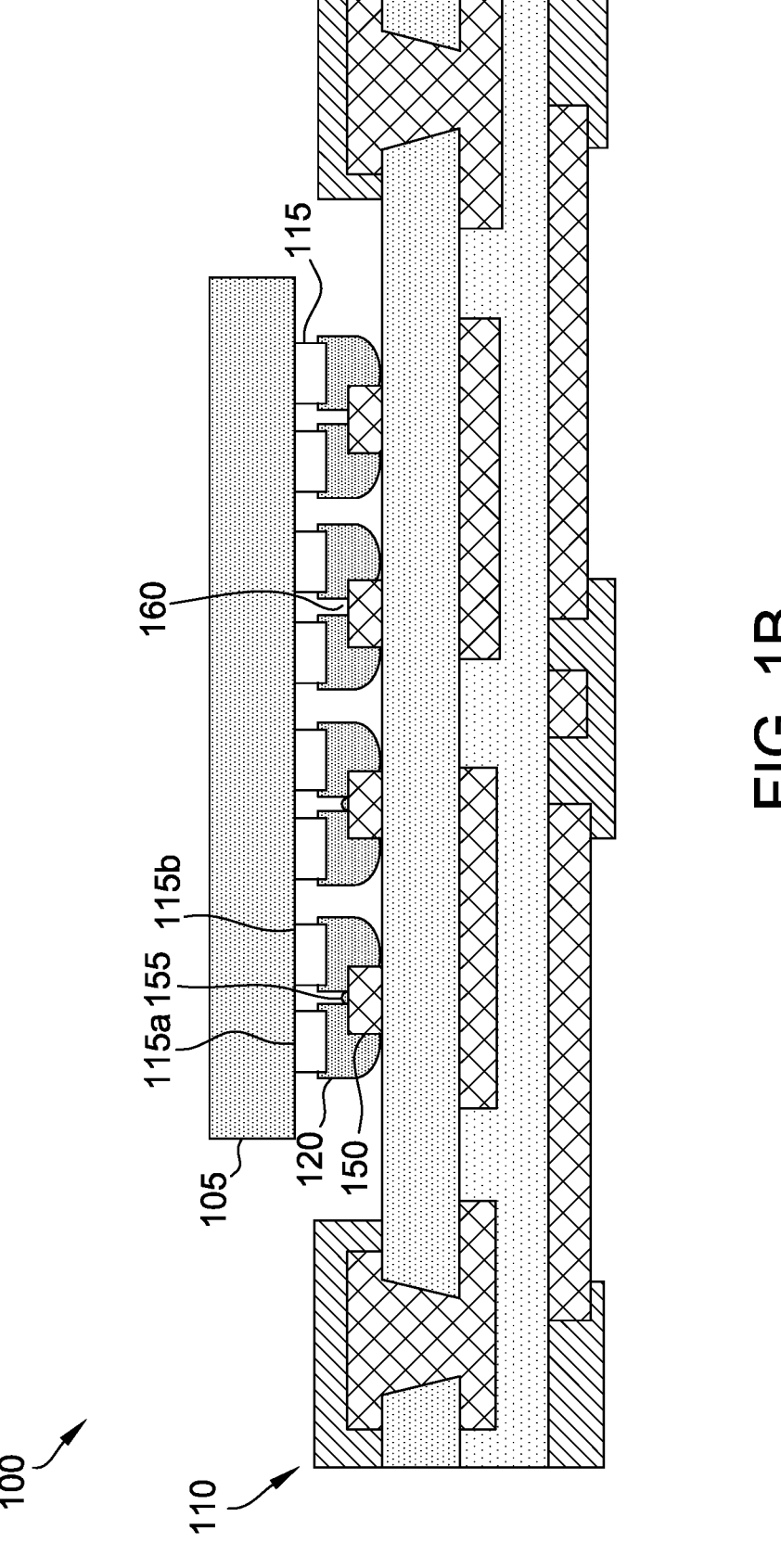
FIG. 1B illustrates the first computing component being communicatively coupled to the second computing component such that a solder bridge is formed on a metal trace of the second computing component according to an example.

FIG. 1B illustrates the first computing component 105 being communicatively coupled to the second computing component 110 such that a solder bridge 155 is formed on a metal trace 150 of the second computing component 110 according to an example. In an example, the solder bridge 155 is formed on the metal trace 150 during a reflow process after the first computing component 105 is mounted on, or otherwise coupled to, the second computing component 110.

For example, the first computing component 105 is mounted to the second computing component 110 such that adjacent interconnects 115 are electrically and/or communicatively coupled to respective metal traces 150 on a surface of the second computing component 110. Although FIG. 1B shows that the first computing component 105 includes four sets of adjacent interconnects 115 (eight interconnects 115 in total), the first computing component 105 may have any number of adjacent interconnects 115.

In another example, the first computing component 105 may include one or more sets of adjacent interconnects 115 and one or more single interconnects 115. As explained above, each of the one or more sets of adjacent interconnects 115 may be coupled to the same metal trace 150 and such that a solder bridge 155 is formed on the metal trace 150 between the adjacent interconnects 115. When one or more single interconnects are included, each of the one or more single interconnects 115 may be coupled to a separate metal trace 150 without the formation of a solder bridge 155. Additionally, it is contemplated that a solder bridge 155 may not be formed between adjacent interconnects 115 on the same metal trace 150.

As briefly described above, a thickness and/or a width of a metal trace 150 may be increased when a solder bridge 155 is formed on the metal trace 155 between two adjacent interconnects 115. For example, a first interconnect 115a and a second interconnect 115b of the first computing component 105 may be electrically and/or communicatively coupled to the same metal trace 150 of the second computing component 110. In an example, the first interconnect 115a is coupled to the metal trace 150 at a first location and the second interconnect 115b is coupled to the metal trace 150 at a second location.

Additionally, the first interconnect 115a and the second interconnect 115b may define a space or area 160. During a reflow process, the solder bridge 155 may be formed in the area 160 defined by the first interconnect 115a and the second interconnect 115b. The solder bridge 155 increases a thickness of the metal trace 150 at least within the area 160. In some examples, the thickness of the metal trace 155 may be increased within the area 160 by up to fifty percent or more, by up to forty percent or more, or by up to thirty percent or more. Although specific ranges are given, these are for example purposes only.

The formation of solder bridges 155 on metal traces 150 may be controlled such that a solder bridge 155 may intentionally be formed on some metal traces 150 and/or on some areas of the second computing component 110 but not others. As shown in FIG. 1B, a solder bridge 155 is formed on two of the metal traces 155 between adjacent interconnects 115 but not on the remaining two metal traces 155.

In an example, the creation of solder bridges 155 between adjacent interconnects 115 and an associated metal trace 150 is based on a number of factors. These factors include, but are not limited to, a size of the solder bump 120 associated with each interconnect 115, the spacing between adjacent interconnects 115 and a thickness or weight of a die of the first computing component 105.

For example, as the amount of solder of the solder bump 120 increases and/or as the distance between metal traces 150 decreases, the more likely that a solder bridge 155 will be formed on the metal trace 150 during a reflow process. In an example, the size of the solder bump 120 is approximately seventy micrometers by forty micrometers. Although seventy micrometers by forty micrometers is specifically mentioned, other dimensions may be used. In an example, the amount of solder of the solder bump 120 is controllable and may be based on a desired size of the solder bump 120 and/or a desired thickness of the solder bridge 155.

In another example, the thickness of the die of the first computing component 105 may be between approximately one hundred and fifty micrometers and approximately sixty-five micrometers. An amount of force on each solder bump 120 may be controlled or adjusted based, at least in part on a thickness of the die. In yet another example, the pitch or gap between each interconnect 115 and/or associated solder bump 120 may be between approximately thirty-five micrometers and approximately fifty micrometers.

Although specific dimensions and ranges are given, these are for example purposes only. Accordingly, it will be appreciated that the formation of a solder bridge 155, as well as a thickness/width of the solder bridge 155, can be controlled by adjusting: the solder bump 120/interconnect 115 pitch; a volume/amount of solder on each solder bump 120; the weight/thickness of the die of the first computing component 105; and/or an amount of pressure applied on/to each solder bump 120 during a mounting process and/or a reflow process. For example, a small pitch coupled with a large solder volume and a high pressure on the solder bump 120 will lead to a higher tendency that a solder bridge 155 will be formed on the desired metal traces 150.

Figure 2:
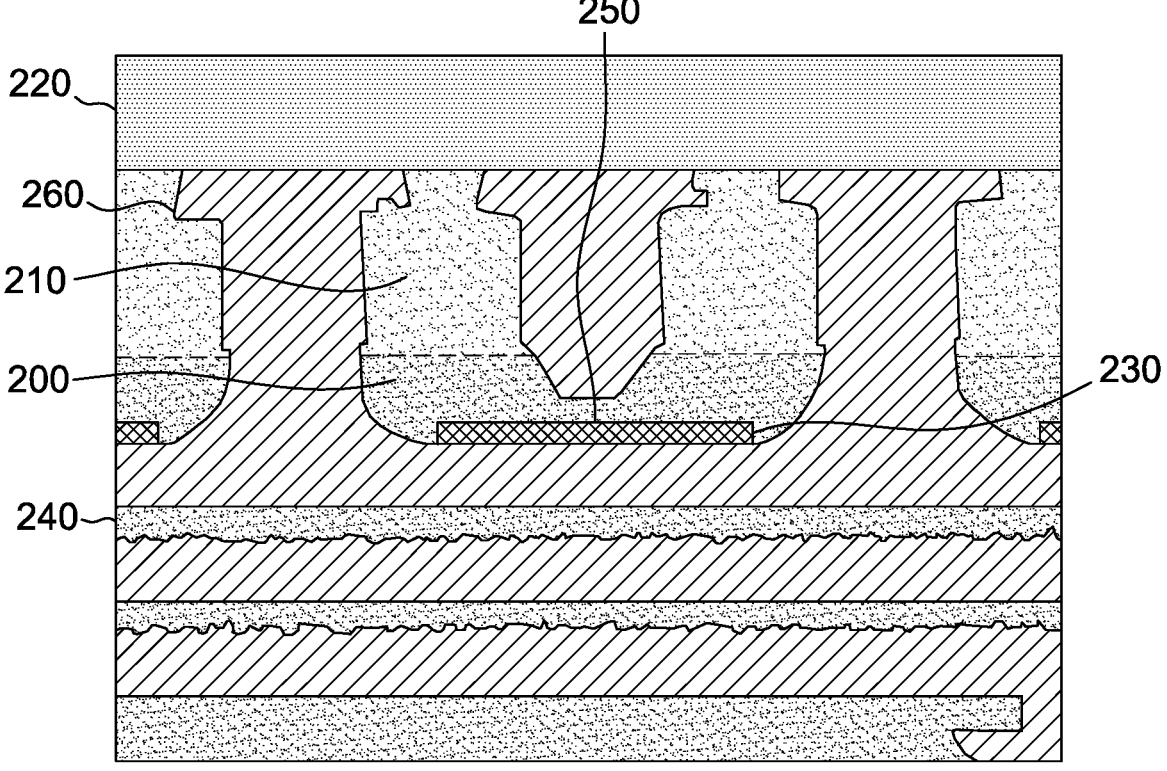
FIG. 2 illustrates how solder associated with an interconnect of a first computing component is used to increase a thickness of a metal trace of a second computing component according to an example.

FIG. 2 illustrates how solder 200 associated with an interconnect 210 of a first computing component 220 is used to increase a thickness of a metal trace 230 of a second computing component 240 according to an example. In the example shown in FIG. 2, the first computing component 220, the solder 200 and the interconnect 210 may be similar to the first computing component 105, the solder bump 120 and the interconnect 115 shown and described with respect to FIG. 1A-FIG. 1B. Likewise, the second computing component 240 and the metal trace 230 may be similar to the second computing component 110 and the metal trace 150 shown and described with respect to FIG. 1A-FIG. 1B.

In the example shown in FIG. 2, adjacent interconnects 210 of a first computing component 220 are coupled to a single metal trace 230. Each interconnect 210 is comprised of a first material (e.g., copper) and may include a solder bump 200. In the example shown in FIG. 2, the dashed line represents a delineation between the interconnect 210 and the solder of the solder bump 200. Additionally, in the example shown in FIG. 2, an underfill material 260 has been applied between the first computing component 220 and the second computing component 240.

During a reflow process, solder of each solder bump 200 melts, subsequently fills a space or area defined by the adjacent interconnects 210 and forms a solder bridge 250. The solder bridge 250 effectively increases a thickness of the metal trace 230—at least in the area defined by the adjacent interconnects 210. The solder bridge effectively reduces impedance mismatch between the first computing component 220 and the second computing component 240.

Figure 3A:
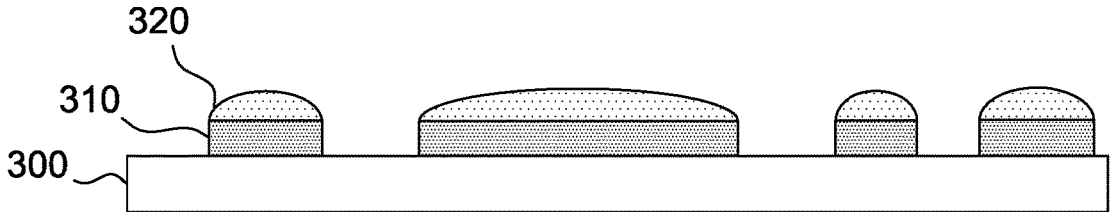
FIG. 3A-FIG. 3B illustrates how solder may be used to increase a thickness of a metal trace of a substrate according to an example.
Figure 3B:
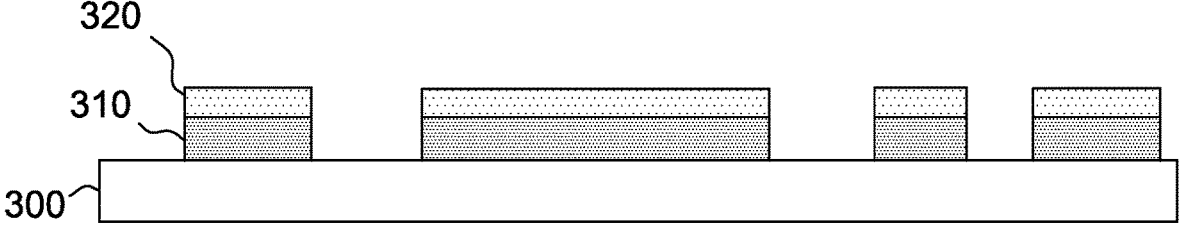

FIG. 3A-FIG. 3B illustrates how solder 320 may be used to increase a thickness of a metal trace 310 of a substrate 300 according to an example. In the example shown in FIG. 3A-FIG. 3B, the substrate 300 may be similar to the second computing component 110 shown and described with respect to FIG. 1A-FIG. 1B. Likewise, the metal trace 310 may be similar to the metal trace 150 shown and described with respect to FIG. 1A-FIG. 1B.

In this example, solder 320 or solder paste may be printed or otherwise provided on a surface of one or more metal traces 310 of the substrate 300. The solder 320 may be provided on the metal trace during a "pre-solder" process that is included as part of a surface mount technology (SMT) process. For example, solder 320 is printed or is otherwise disposed/provided on the metal trace 310 of the substrate 300 prior to a stencil printing process or a component placement process of the SMT process. Surface tension associated with the metal trace 310 may prevent the solder from spilling onto the substrate.

Once the solder 320 is printed on the metal trace 310, a reflow process causes the solder 320 on the metal trace 310 to fuse to the metal trace 310 such as shown in FIG. 3B. As such, an overall thickness of the metal trace 310 may increase. As with the other examples described herein, the thickness of the metal trace 310 may increase based on an amount of solder 320 provided on the surface of the metal trace 310 during the pre-solder process.

In some examples, the pre-solder process described with respect to FIG. 3A and FIG. 3B may be combined with the solder bridge technique described with respect to FIG. 1A-FIG. 1B.

Figure 4:
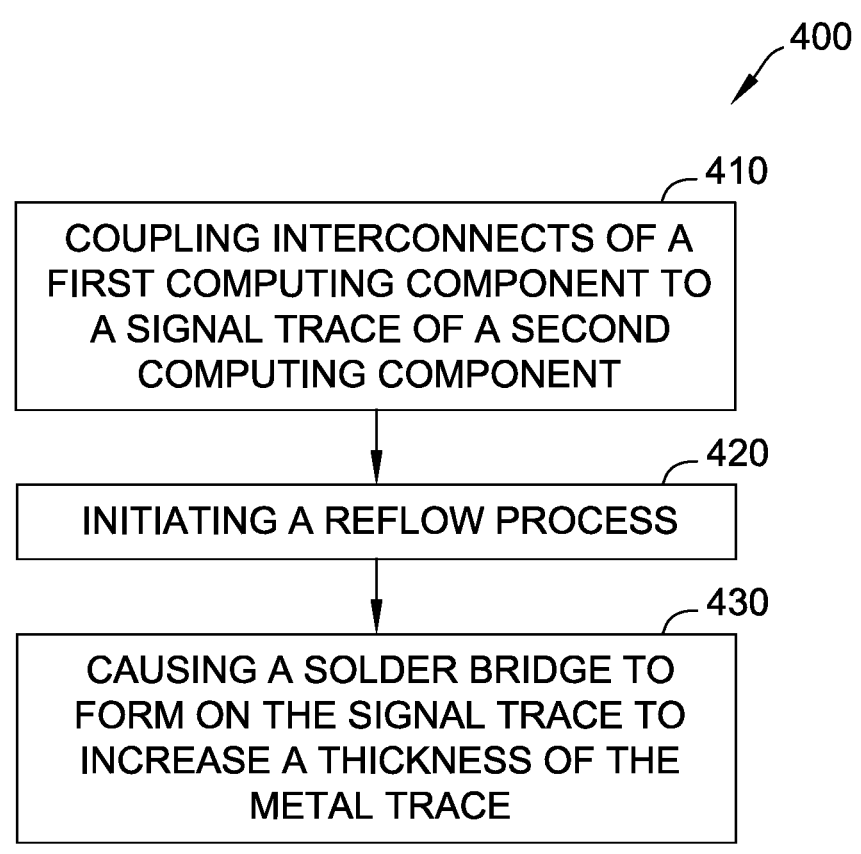
FIG. 4 illustrates a method for communicatively coupling a first computing component to a second computing component according to an example.

FIG. 4 illustrates a method 400 for communicatively coupling a first computing component to a second computing component according to an example. The method 400 may be used to couple the first computing component 105 shown and described with respect to FIG. 1A-FIG. 1B with the second computing component 110 shown and described with respect to FIG. 1A-FIG. 1B.

Method 400 begins when interconnects of the first computing component are aligned and or otherwise coupled (410) to respective signal traces or metal traces provided on a surface of the second computing component. In an example, the first computing component is a flip chip die that includes one or more copper pillars and/or solder bumps and the second computing component is a substrate or a printed circuit board.

In an example, the first computing component may include multiple interconnects. In this example, at least two of the interconnects are coupled to the same signal trace. Additionally, the at least two interconnects define a space or area in between the at least two interconnects.

Once the first computing component and the second computing component are coupled, a reflow process is initiated (420). The reflow process causes the solder bumps associated with the at least two interconnects that are coupled to the same signal trace to flow within the space or area. The solder then forms (430) a solder bridge on the surface of the signal trace of the second computing component. The solder bridge increases a thickness and/or a width of the signal trace at least in the space defined by the at least two interconnects.

Formation of the solder bridge, as well as a thickness of the solder bridge, may be controlled by one or more of: adjusting solder bump/interconnect pitch; adjusting a volume/amount of solder on each solder bump; adjusting a weight/thickness of a die of the first computing component; and/or adjusting an amount of pressure applied on each solder bump during a mounting process and/or a reflow process.

Based on the examples described herein, examples of the present application describe an integrated circuit, comprising: a substrate comprising a metal trace, the metal trace having a thickness; a computing component comprising: a first interconnect having a first solder bump and being electrically coupled to the metal trace at a first location on the metal trace; a second interconnect having a second solder bump and being electrically coupled to the metal trace at a second location on the metal trace; and a solder bridge formed on the metal trace between the first solder bump and the second solder bump, the solder bridge increasing the thickness of the metal trace in an area defined by the first interconnect and the second interconnect. In an example, the first interconnect and the second interconnect are copper pillars. In an example, the computing component is a flip chip die. In an example, a thickness of a die of the flip chip die is between approximately sixty-five micrometers and approximately seventy-five micrometers. In an example, a size of the first solder bump and a size of the second solder bump is approximately seventy micrometers by approximately forty micrometers prior to the solder bridge being formed on the metal trace. In an example, the solder bridge increases the thickness of the metal trace in the area defined by the first interconnect and the second interconnect by approximately thirty percent or more. In an example, a distance between the first interconnect and the second interconnect is between approximately thirty-five micrometers and approximately fifty micrometers.

In another example, a method for coupling a first computing component to a second computing component is disclosed. In this example, the method includes coupling a solder bump of a first interconnect of the first computing component and a solder bump of a second interconnect of the first computing component to a metal trace of the second computing component; and causing a solder bridge to form on the metal trace between the solder bump of the first interconnect and the solder bump of the second interconnect, the solder bridge forming on the metal trace in an area defined by the first interconnect and the second interconnect. In an example, the metal trace has a first thickness and wherein the solder bridge causes the metal trace to have a second thickness in the area defined by the first interconnect and the second interconnect. In an example, the second thickness is more than approximately thirty percent greater than the first thickness. In an example, the first computing component is a flip chip dic and the second computing component is a substrate. In an example, a thickness of a die of the flip chip die is approximately seventy-five micrometers. In an example, a thickness of a die of the flip chip die is approximately sixty-five micrometers. In an example, a size of the solder bump of the first interconnect and a size of the solder bump of the second interconnect is approximately seventy micrometers by approximately forty micrometers prior to the solder bridge forming on the metal trace. In an example, the first interconnect and the second interconnect are comprised of copper. In an example, a distance between the first interconnect and the second interconnect is between approximately thirty-five micrometers and approximately fifty micrometers.

Examples of the present disclosure also describe an integrated circuit, comprising: a substrate comprising a connection means, the connection means having a thickness; a computing component comprising: a first interconnect means having a first attachment means and being electrically coupled to the connection means at a first location on the connection means; a second interconnect means having a second attachment means and being electrically coupled to the connection means at a second location on the connection means; and a bridge formed on the connection means between the first attachment means and the second attachment means, the bridge increasing the thickness of the connection means in an area defined by the first interconnect means and the second interconnect means. In an example, the first interconnect means is comprised of copper and wherein the first attachment means is comprised of solder. In an example, the computing component comprises a die and wherein a thickness of the die is between approximately sixty-five micrometers and approximately seventy-five micrometers. In an example, a size of the first attachment means is approximately seventy micrometers by approximately forty micrometers prior to a reflow process.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B. A-C. B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. An integrated circuit, comprising:
a substrate comprising a metal trace having a substantially uniform width along a length of the metal trace, the metal trace having a first thickness;
a computing component comprising:
a first interconnect having a first solder bump and being electrically coupled to the metal trace at a first location on the metal trace;
a second interconnect having a second solder bump and being electrically coupled to the metal trace at a second location on the metal trace; and
a solder bridge formed on a surface of the metal trace between the first solder bump and the second solder bump, the solder bridge increasing the thickness of the metal trace to a second thickness greater than the first thickness in an area defined by the first interconnect and the second interconnect.

2. The integrated circuit of claim 1, wherein the first interconnect and the second interconnect are copper pillars.

3. The integrated circuit of claim 1, wherein the computing component is a flip chip die.

4. The integrated circuit of claim 3, wherein a thickness of a die of the flip chip die is between approximately sixty-five micrometers and approximately seventy-five micrometers.

5. The integrated circuit of claim 1, wherein a size of the first solder bump and a size of the second solder bump is approximately seventy micrometers by approximately forty micrometers prior to the solder bridge being formed on the metal trace.

6. The integrated circuit of claim 1, wherein the second thickness is approximately thirty percent greater than the first thickness.

7. The integrated circuit of claim 1, wherein a distance between the first interconnect and the second interconnect is between approximately thirty-five micrometers and approximately fifty micrometers.

8. A method for coupling a first computing component to a second computing component, comprising:
coupling a solder bump of a first interconnect of the first computing component and a solder bump of a second interconnect of the first computing component to a metal trace of the second computing component, the metal trace having a uniform width along a length of the metal trace and having a first thickness; and
causing a solder bridge to form on a surface of the metal trace between the solder bump of the first interconnect and the solder bump of the second interconnect during a reflow process, the solder bridge forming on the metal trace in an area defined by the first interconnect and the second interconnect, the solder bridge increasing the thickness of the metal trace to a second thickness greater than the first thickness.

9. The method of claim 8, wherein the solder bridge reduces an impedance mismatch between the first computing component and the second computing component.

10. The method of claim 8, wherein the second thickness is more than approximately thirty percent greater than the first thickness.

11. The method of claim 8, wherein the first computing component is a flip chip die and the second computing component is a substrate.

12. The method of claim 11, wherein a thickness of a die of the flip chip die is approximately seventy-five micrometers.

13. The method of claim 11, wherein a thickness of a die of the flip chip die is approximately sixty-five micrometers.

14. The method of claim 8, wherein a size of the solder bump of the first interconnect and a size of the solder bump of the second interconnect is approximately seventy micrometers by approximately forty micrometers prior to the solder bridge forming on the metal trace.

15. The method of claim 8, wherein the first interconnect and the second interconnect are comprised of copper.

16. The method of claim 8, wherein a distance between the first interconnect and the second interconnect is between approximately thirty-five micrometers and approximately fifty micrometers.

17. An integrated circuit, comprising:
a substrate comprising a connection means having a uniform width along a length of the connection means, the connection means having a first thickness;

a computing component comprising:

a first interconnect means having a first attachment means and being electrically coupled to the connection means at a first location on the connection means;

a second interconnect means having a second attachment means and being electrically coupled to the connection means at a second location on the connection means; and a bridge formed on a surface of the connection means between the first attachment means and the second attachment means, the bridge increasing the thickness of the connection means to a second thickness greater than the first thickness in an area defined by the first interconnect means and the second interconnect means.

18. The integrated circuit of claim 17, wherein the first interconnect means is comprised of copper and wherein the first attachment means is comprised of solder.

19. The integrated circuit of claim 17, wherein the computing component comprises a die and wherein a thickness of the die is between approximately sixty-five micrometers and approximately seventy-five micrometers.

20. The integrated circuit of claim 17, wherein a size of the first attachment means is approximately seventy micrometers by approximately forty micrometers prior to a reflow process.

* * * * *